(12) United States Patent
Thompson (10) Patent No.: US 12,052,830 B2
(45) Date of Patent: Jul. 30, 2024

(54) METHOD AND PROCESS FOR CREATING HIGH-PERFORMANCE COAX SOCKETS

(71) Applicant: R&D Circuits, South Plainfield, NJ (US)

(72) Inventor: Donald Eric Thompson, Freemont, CA (US)

(73) Assignee: Advantest America, Inc., San Jose, CA (US)

( * ) Notice: Subject to any disclaimer, the term of this patent is extended or adjusted under 35 U.S.C. 154(b) by 0 days.

(21) Appl. No.: 17/542,867

(22) Filed: Dec. 6, 2021

(65) Prior Publication Data
US 2023/0180397 A1    Jun. 8, 2023

(51) Int. Cl.
| | |
|---|---|
| H05K 3/42 | (2006.01) |
| C25D 3/38 | (2006.01) |
| C25D 5/02 | (2006.01) |
| C25D 7/00 | (2006.01) |
| H05K 1/02 | (2006.01) |
| H05K 1/18 | (2006.01) |
| H05K 3/00 | (2006.01) |
| H05K 3/36 | (2006.01) |

(52) U.S. Cl.
CPC ............... *H05K 3/426* (2013.01); *C25D 3/38* (2013.01); *C25D 5/02* (2013.01); *C25D 7/00* (2013.01); *H05K 1/0222* (2013.01); *H05K 1/182* (2013.01); *H05K 3/0047* (2013.01); *H05K 3/368* (2013.01); *H05K 2201/09072* (2013.01); *H05K 2201/09545* (2013.01); *H05K 2201/10303* (2013.01); *H05K 2201/10325* (2013.01); *H05K 2201/10409* (2013.01); *H05K 2203/0723* (2013.01)

(58) Field of Classification Search
CPC ... C25D 3/38; C25D 5/02; C25D 7/00; H05K 1/0222; H05K 1/182; H05K 3/0047; H05K 3/268; H05K 3/426; H05K 2201/09545; H05K 2201/09072; H05K 2201/10303; H05K 2201/10325; H05K 2201/10409; H05K 2203/0723
See application file for complete search history.

(56) References Cited

U.S. PATENT DOCUMENTS

| | | | |
|---|---|---|---|
| 4,678,865 A | 7/1987 | Sherwin | |
| 5,477,159 A | 12/1995 | Hamling | |
| 5,791,911 A * | 8/1998 | Fasano | H05K 1/0243 439/63 |
| 5,959,514 A | 9/1999 | Smith et al. | |
| 6,028,497 A * | 2/2000 | Allen | H01L 23/66 333/260 |
| 6,479,764 B1 | 11/2002 | Frana et al. | |
| 6,495,938 B2 | 12/2002 | Naito et al. | |
| 6,512,389 B1 * | 1/2003 | Kocher | G01R 1/07371 324/754.14 |

(Continued)

*Primary Examiner* — Jeffrey T Carley
*Assistant Examiner* — Jose K Abraham (57) ABSTRACT

The present invention provides a novel method of constructing a coax spring-pin socket that furnishes better performance and is easier to manufacture in volume using common dielectrics and copper plating. This is accomplished by, in application, a lamination of PCB dielectric layers. This dielectric block is then drilled, plated, etched, and drilled in steps for the construction of a coaxial structure for the signal pins, and a ground structure for ground pins. This design process that can be quickly adjusted and customized for each design.

12 Claims, 7 Drawing Sheets

Step #2

Step #3

(56) References Cited

U.S. PATENT DOCUMENTS

| | | | |
|---|---|---|---|
| 6,707,311 B2 | 3/2004 | Hohenwarter | |
| 6,717,060 B2 * | 4/2004 | Kragl | H05K 1/0272 |
| | | | 174/254 |
| 6,802,720 B2 | 10/2004 | Weiss et al. | |
| 7,091,424 B2 | 8/2006 | Oggioni et al. | |
| 7,230,318 B2 | 6/2007 | Kripesh et al. | |
| 7,282,378 B2 * | 10/2007 | Yoshida | G01R 1/045 |
| | | | 324/755.05 |
| 7,310,455 B2 | 12/2007 | Yakymyshyn et al. | |
| 7,364,461 B1 * | 4/2008 | Back | H05K 3/429 |
| | | | 439/329 |
| 7,423,439 B2 | 9/2008 | Kasukabe et al. | |
| 7,767,913 B2 | 8/2010 | Corisis et al. | |
| 7,815,466 B2 | 10/2010 | Yaghmai et al. | |
| 8,026,733 B2 | 9/2011 | Lee et al. | |
| 8,354,601 B2 | 1/2013 | Russell | |
| 9,685,717 B2 | 6/2017 | Warwick et al. | |
| 10,534,033 B2 * | 1/2020 | Nakamura | G01R 1/0466 |
| 11,171,434 B2 * | 11/2021 | Narumi | H01R 13/6473 |
| 2002/0131256 A1 * | 9/2002 | Smith | H01L 24/17 |
| | | | 361/780 |
| 2007/0018190 A1 | 1/2007 | Kim et al. | |
| 2008/0185180 A1 | 8/2008 | Cheng et al. | |
| 2009/0020326 A1 | 1/2009 | Takahashi et al. | |
| 2009/0086446 A1 * | 4/2009 | Sugimoto | H05K 3/284 |
| | | | 361/752 |
| 2013/0078860 A1 * | 3/2013 | Rathburn | H01R 12/7082 |
| | | | 439/700 |
| 2013/0203298 A1 * | 8/2013 | Zhou | H01R 13/42 |
| | | | 439/700 |
| 2017/0059611 A1 * | 3/2017 | Lesnikoski | G01R 1/045 |
| 2017/0187133 A1 * | 6/2017 | Sepic | H01R 12/00 |
| 2017/0231099 A1 * | 8/2017 | Mundt | H05K 3/0047 |
| 2019/0128950 A1 * | 5/2019 | Mardi | G01R 31/2891 |

* cited by examiner

FIG. 1 - *Typical Coax Spring Pin Construction* Prior Art

| FIG. 2A | FG. 2C | FIG.2E | FG. 2G | FIG.2I |
|---------|--------|--------|--------|--------|
| Step #1 | Step #2 | Step #3 | Step #4 | Step #5 |

| FIG. 2B | Fig. 2D | FIG. 2F | FIG. 2H | FIG.2J |

FIGS 2A-2J : Coax Pin Manufacturing Steps

FIG. 3 Assembly Drawing

GENERIC HOLE PROFILE

Step #1　　　Step #2　　　Step #3

GROUND HOLE PROFILE

Step #1　　Step #2　　Step #3　　Connection Detail

POWER HOLE PROFILE

Step #1      Step #2      Step #3      Step #4

Fig. 10B      Fig. 10D      Fig. 10F      Fig. 10H

METHOD AND PROCESS FOR CREATING HIGH-PERFORMANCE COAX SOCKETS

BACKGROUND

1. Field

The present invention is related to the field of high frequency and low power impedance electrical interconnects.

Spring pin sockets are commonly used for testing packaged Integrated Circuits (ICs) in any application where a direct solder connection is undesirable. Testing ICs during manufacturing and burn-in testing are examples of this. Additionally, spring pins can be used to electrically connect one printed circuit board (PCB) to another PCB. A spring pin provides a mechanically compliant connection that can deal with physical tolerance differences between parts, however there are performance impacts from using spring pins. High-speed digital or analog signals are negatively impacted by impedance discontinuities while traveling through the spring-pins and high-speed power signals are negatively impacted by the relatively high inductance of individual spring-pins or high capacitance of spring-pin arrays.

High-speed signals typically run on a 50-ohm transmission line. Common examples of this are coax cables, a strip-line trace in an IC package, or a micro-strip or strip-line trace on a PCB. Each of the previously mentioned examples are impedance controlled within certain manufacturing tolerances, for example 50 ohms+/−5 ohms is common on PCBs. In industry only a small quantity of spring pin interconnects are impedance controlled and these are typically significantly more expensive than non-impedance controlled interconnects.

Impedance control is done by adjusting the spacing between the signal and return path (also referred to as "ground") and taking into account the dielectric material or materials between signal and ground. Given knowledge of the dielectrics and physical dimensions of the conductor and return, the impedance can be calculated or simulated in a 3D field solver.

Common transmission line structures have well known equations for calculating their impedance. For example, the equation for the impedance of a coax transmission line is:

$$Z_0 = \sqrt{\frac{L}{c}} = \frac{1}{2\pi}\sqrt{\frac{\mu}{\epsilon}} \ln\frac{D}{d}$$

Where L=inductance, C=capacitance, μ=permeability, ε=dielectric constant, D=outer diameter of conductor, d=inner diameter of conductor The most common way to impedance control spring-pin interconnects is to create a conductive coaxial structure around a single pin that using the above equation can be designed to create a 50 ohm transmission line. Most commonly this is created by drilling a holes in a block of aluminum and using plastic non-conductive donut-like inserts to keep spring-pins centered in the hole and not touching the conductive block. This is relatively simple to manufacture but adds significant cost in assembly since it is normally done by hand.

It would be desirable to provide a manufacturing solution that provides for better performance and provides for lower manufacturing costs for volume production.

SUMMARY

The present invention provides for a novel method that overcomes the drawbacks of the prior art proposals by providing a novel alternate method of constructing a coax spring-pin socket that furnishes better performance and is easier to manufacture in volume using common dielectrics and copper plating.

The process described in the present invention starts with a dielectric block of material. In one application of this patent we can use a lamination of PCB dielectric layers. This dielectric block is then drilled, plated, etched, and drilled in steps detailed later that allow for the construction of a coaxial structure for the signal pins, and a ground structure for ground pins. This is a highly configurable design process that can be quickly adjusted and customized for each design.

BRIEF DESCRIPTION OF THE DRAWINGS

FIG. 2A-2J show the steps of the methodology of the present invention manufacturing the coax spring pin in which FIGS. 2A and 2B illustrate the first step in which FIG. 2B is a top view of FIG. 2A;

FIGS. 2E and 2F illustrate the third wherein FIG. 2F is to view of FIG. 2E;

FIGS. 2G and 2H illustrate the fourth step wherein FIG. 2H is a top view of FIG. 2H;

FIGS. 2I and 2J illustrate the fourth step wherein FIG. 2J is a top view of FIG. 2I;

FIGS. 5A and B illustrates alternate spring pin hole types for the present invention in which:

FIGS. 6A-6E illustrate the assembly of the pins into the PCB coaxial socket in five steps in accordance with the teachings of the present invention in which:

FIGS. 7A-7B illustrate the attachment and alignment for the guide plate, the solder ball nest, both halves of the socket body, the pin guide frame and the dielectric separator using the alignment pin in accordance with the teachings of the present invention in which:

FIGS. 8A-10H show three alternate pin types for the present invention in which:

FIGS. 8A-8F illustrate generic hole pin in three steps and a the assembly of the pins into the PCB coaxial socket in five steps in accordance with the teachings of the present invention in which:

FIGS. 9A-9H illustrate ground hole pin in three steps and a connection step detailed in accordance with the teachings of the present invention in which:
FIG. 9G is the connection step detailed;
FIGS. 10A-10H illustrate the power hole pin in four steps in accordance with the teachings of the present invention in which.

DETAILED DESCRIPTION OF THE PREFERRED EMBODIMENT(S)

The methodology of the present invention described herein with reference to the drawings of FIGS. 1-10H.

Figure 1:
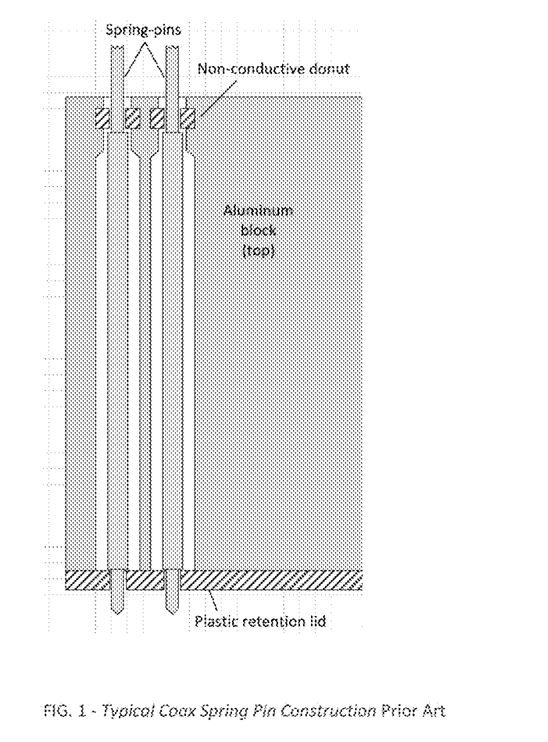
FIG. 1 illustrates a prior art coax spring pin construction.
Figure 2A:
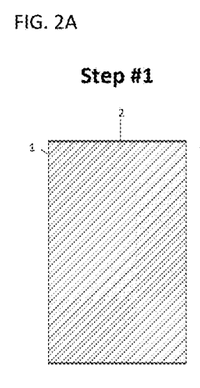
Figure 2B:
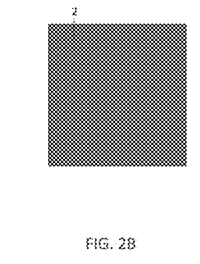

The process steps to create coaxial signal pin path of the present invention are as follows:

Step 1, as shown in FIGS. 2A-2B: Create socket body 10

First in accordance with the present application, the body 1 is created by laminating a PCB core and PCB pre-preg laminates together to form a single sheet of material. The material can be varying thicknesses depending on the quantity and thickness of the construction laminates. This can also be machined to a target thickness if needed. This thickness will typically be between 0.100 and 0.200 inches thick and will depend on the spring pin used as well as the device under test (DUT) mating requirements, such as LGA (land grid array), BGA (ball grid array), or if a "floating plate" is required.

Additionally, a layer or copper 2 is added or left on the top and bottom of the body 1. This will later be used for electroplating.

Figure 2C:
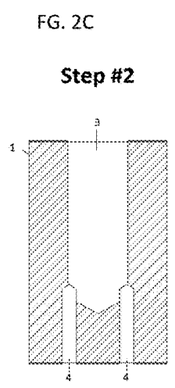
FIGS. 2C and 2D illustrate the second step wherein FIG. 2D a top view of FIG. 2C.
Figure 2D:
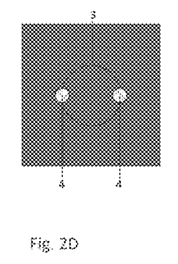

The next step, step 2 shown in FIGS. 2C-2D, holes are drilled holes into the body 1

For the construction of a coax structure a primary hole 3 as well as a one or more vent holes 4 are drilled in offset from the spring-pin location. The vent holes provide two benefits: First the vent holes 4 allow for plating solution to flow through the body more easily and enable better plating. Second, the vent holes 4 provide a signal return path that is adjacent to the large coax return path and connects to the top or bottom of the socket.

Figure 2E:
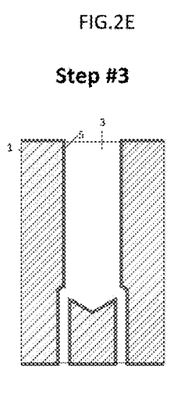
Figure 2F:
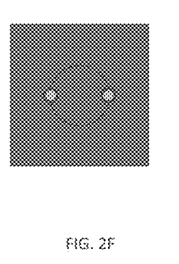

Step 3 shown in FIGS. 2E-2F, plates the holes in the PCB body 1.

Electro-plate copper 5 into the hole of the dielectric body 1. This process requires several steps but is a common process in the industry. The basic steps are chemically cleaning the holes. This process itself has several steps and can include among others plasma-desmear, acid or caustic rinse cycles. A conductive seed layer is applied that allows for electro-plating into the hole. This is most commonly immersion in an electroless copper solution but can be other conductive materials. An electrical current is then applied while the dielectric body 1 it is submerged into a copper plating solution.

Additional plating will be added to prevent the copper from oxidizing or to provide a lower and more stable contact resistance between the spring-pin and plating on the dielectric body.

The two most common solutions for this will be "hard gold" plated over nickel plated on the existing copper and ENEPIG. "Hard gold" refers to an impurity added into the gold to make it harder. ENEPIG stands for electroless nickel electroless palladium immersion gold and it replaces hard gold with palladium for hardness and immersion gold.

TABLE 1

| Typical plating thickness | | |
| --- | --- | --- |
| | Hard Gold Plating | ENEPIG Plating |
| Copper | 500 μinch | 500 μinch |
| Nickel | 300 μinch | 150 μinch |
| Hard Gold | 50 μinch | |
| Palladium | | 10 μinch |
| Gold | | 5 μinch |

Figure 2G:
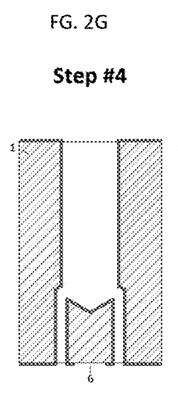
Figure 2H:
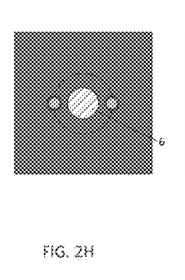

Step 4, see FIGS. 2G-2H), requires the removal of selected copper 6 on the surface of the socket body 1.

This copper must be removed to create a larger gap between the return path and the spring-pin. This can be done chemically or physically in one of several ways. The likely options are masking and chemically etching the copper, drilling out the copper, or laser ablating the copper for example. In this instance we will mask and etch the copper.

In step 5, (see FIGS. 2I-2J) involves a two step drilling operation.

Figure 2I:
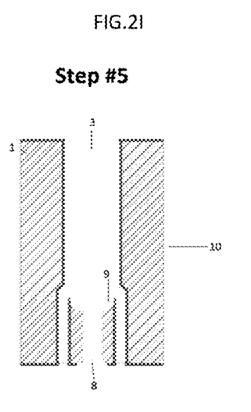
Figure 2J:
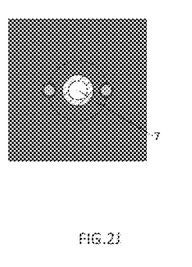
Figure 3:
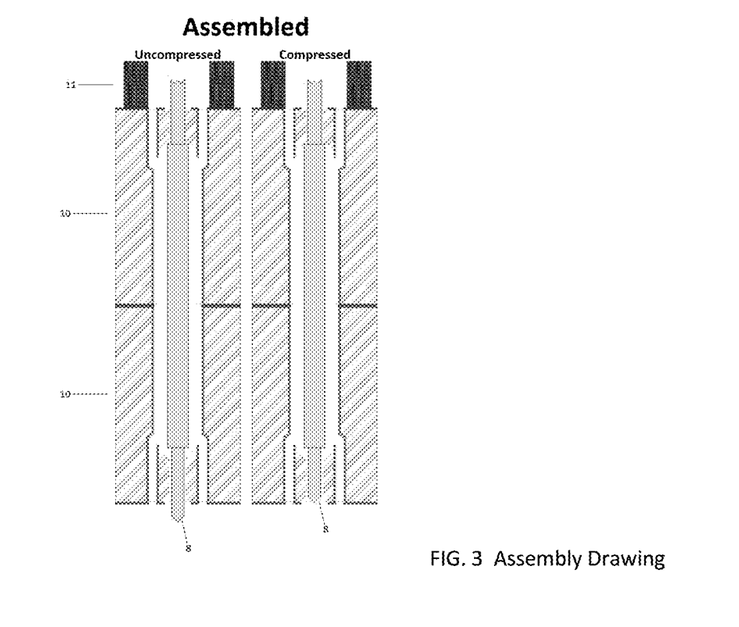
FIG. 3 shows the assembled construction of the coax spring pin according to the teachings of the present invention.

Two drill operations are done to drill the hole that the spring pin plunger will go through 8 and a drill to remove the plating or conductive connection 9 inside the coax hole 3.

Step 6 for the pin assembly is illustrated in FIGS. 6A-6E.

In step 6A-6E two pieces of construction described in steps 1-5 are used to retain a spring pin 8. If needed, other steps are added at this point such as lead in features, a solder-ball nest 11, alignment features, and or mechanical attachment features.

Figure 6A:
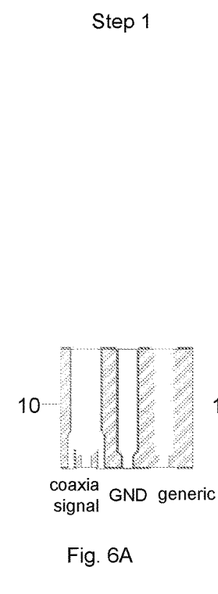
FIG. 6A is the first step of the assembly.
Figures 6B, 6C, 6D, 6E:
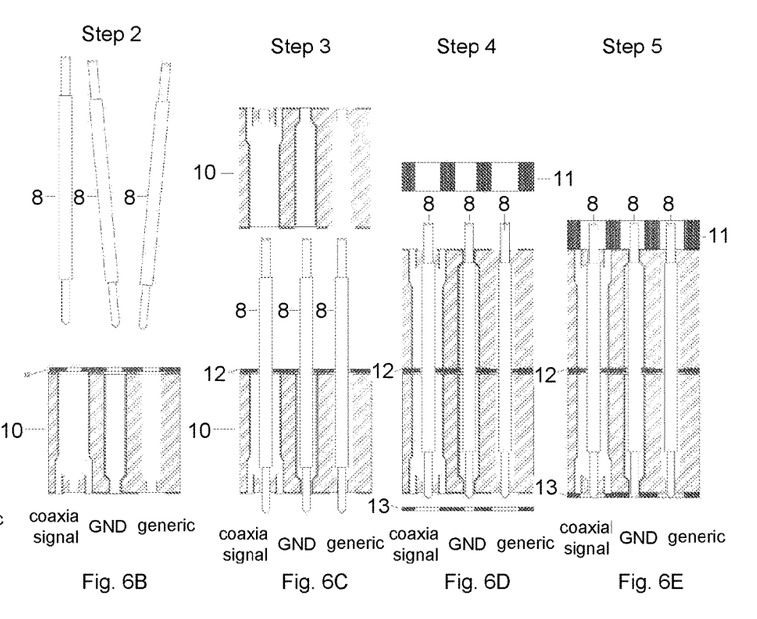
FIG. 6B is the second step of the assembly.
FIG. 6C is the third step of the assembly.
FIG. 6D is the fourth step of the assembly.
FIG. 6E is the fifth step of the assembly.

If required step 1, FIG. 6A, is to add a dielectric pin-guide-frame 12 in between to one socket body half (10) as is shown in FIGS. 6B and 6C. In this instance this is a 5 mil thick laser cut sheet of polyimide. The pin-guide-frame 12 holds all pins in a similar vertical orientation to make it easy to assemble the $2^{nd}$ socket body half 10 retaining all the spring-pins 8 between the two halves as shown in step 3, FIG. 6C.

Step 4, FIG. 6D, adds an optional dielectric separator 13 that will electrically isolate the socket body half 12 from the PCB 30 that this will be mounted on and an optional solder ball nest 11. In this instance these are both adhesive backed laser cut polyimide.

Step 5, FIG. 6E, shows the final assembly. The two socket body halfs are typically retained by screws after assembly.

Figure 4A:
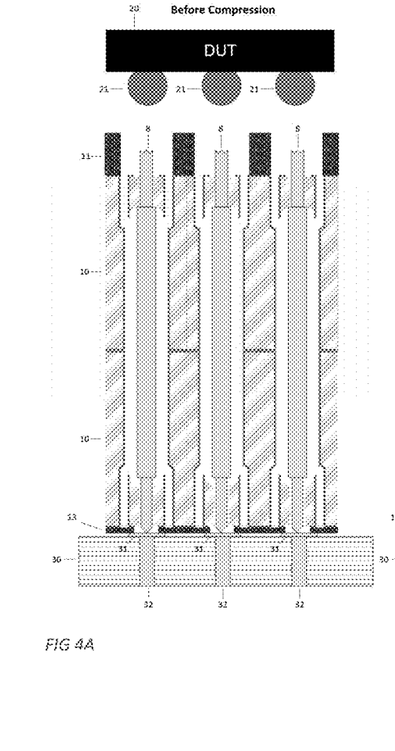
FIG. 4A illustrates the coax spring pins of the present invention prior to compression.
Figure 4B:
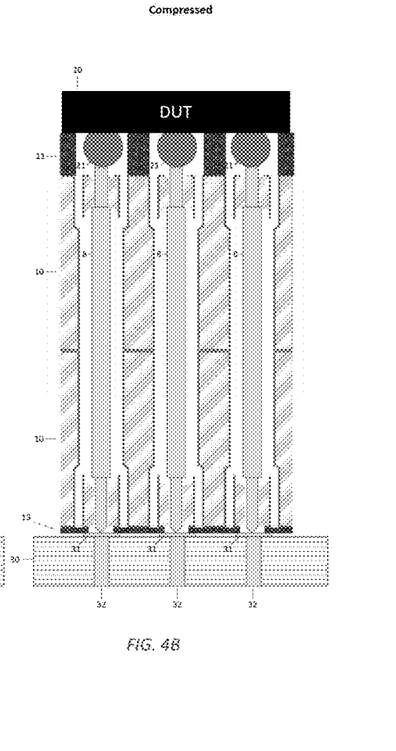
FIG. 4B illustrates the coax spring pins of the present invention I when compressed.
Figure 5A:
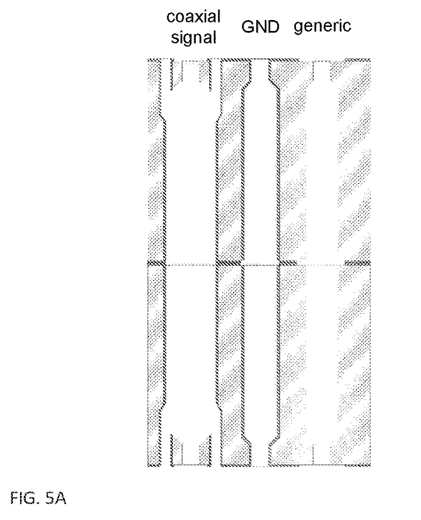
FIG. 5A shows a ground pin having a fully plated hole that is adjacent to the coax signal pin and a generic pin is also shown.
Figure 5B:
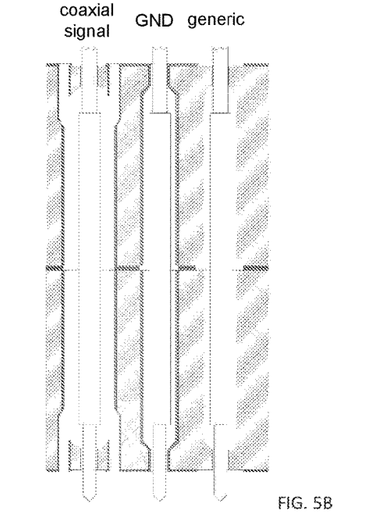
FIG. 5B shows or return pin path that is electrically connected to the return path of the coax and a generic pin is also shown.

The optional solderball nest 11 helps align the DUT's 20 solder balls 21 with the spring pins 8. Additionally, it limits the depth the solder balls 21 can compress the spring pins (8) preventing damage from over-compression. This is shown in FIGS. 4a-4B which illustrates before and after compression, respectively.

The optional dielectric separator 13 provides electrical isolation between the plated copper on the socket body 10 and the PCB pads 31.

Figure 7A:
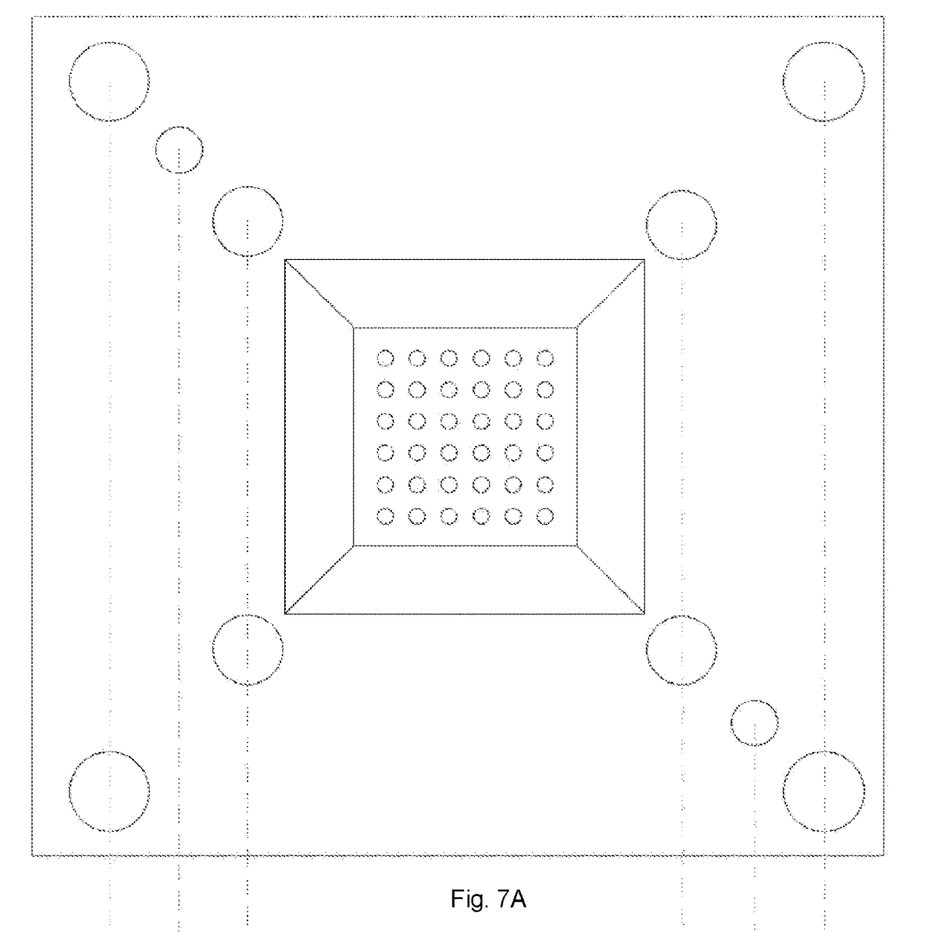
FIG. 7A is a top view of FIG. 7B.
Figure 7B:
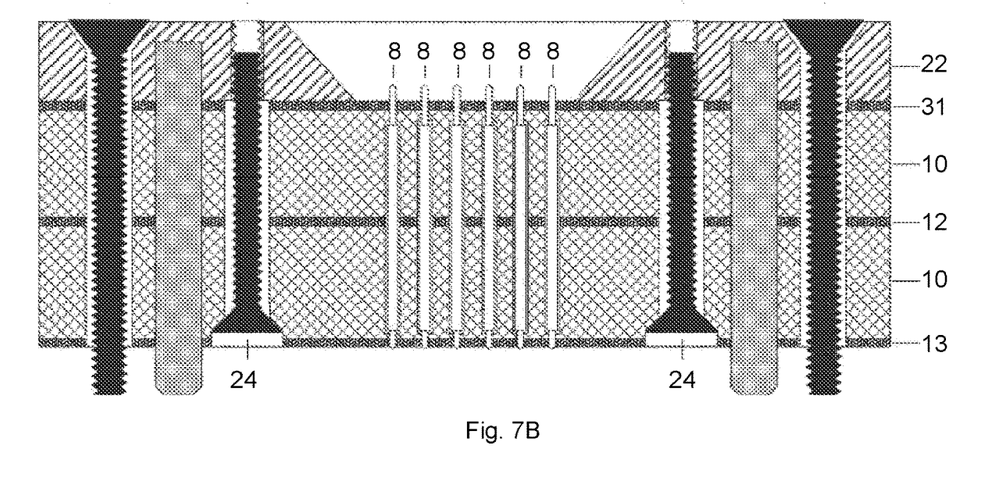
FIG. 7B is front view showing the attachment and alignment.

Step 7 involves the socket assembly shown in FIGS. 7A-7B.

An alignment pin 25 is used to align the following pieces together; the guide plate 22, the solder ball nest 11, both halves of the socket body 10, the pin guide frame 12, and dielectric separator as shown in FIGS. 7A-7B.

Screws 24 are used to capture all aligned pieces together so the socket can be handled as an assembly. The alignment pin protrudes out the bottom of the socket and is used to align the socket to the PCB 30. Additional screws 23 are used to screw the socket down to the PCB 30.

The selection of drill for the outer diameter of the primary hole (3) in addition to the diameter of the spring-pin (8) plus the dielectric constant of air gives us the following equation of the $$Z_0 \approx 138\pi \log_{10} \frac{D}{d}$$

Where D=dimension of the primary hole (3) minus 2*plating thickness, d=outer diameter of spring-pin For any given design a drill size can be selected to create the target impedance. This allows for easy adjustment of the socket impedance which provides the maximum signal integrity performance.

Alternate pin types are described below for the present invention.

The three alternate pin types for the present invention include: a generic pin, FIGS. 8A-8F, a ground pin, FIGS. 9A-9H and a power pin, FIGS. 10A-10H.

Generic Pin

The generic pin is used for any pin that does not meet any of the criteria for the other 3 pins. A generic pin cavity has no plating in the holes. It is the simplest construction pin cavity.

Figure 8A:
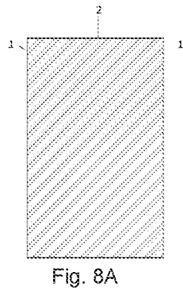
FIG. 8A is the first step of the assembly for the generic hole pin.
Figure 8B:
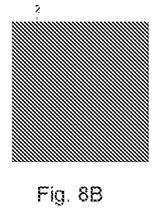
FIG. 8B is the top view of FIG. 8A.

Step 1: Use same socket body created in step 1 for coax pin structure

Figure 8C:
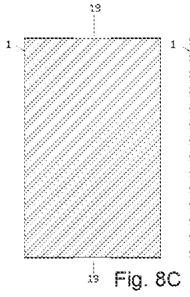
FIG. 8C is the second step of the assembly.
Figure 8D:
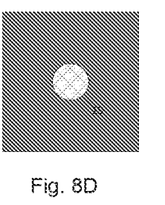
FIG. 8D is the top view of FIG. 8C.

Step 2: Chemically or mechanically remove the copper around the pin location 19

Figure 8E:
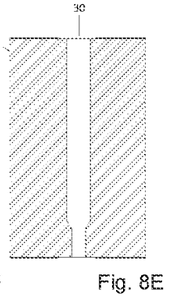
FIG. 8E is the third step of the assembly.
Figure 8F:
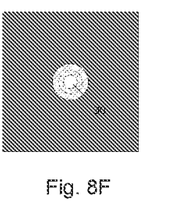
FIG. 8F is the top view of FIG. 8E.

Step 3: Drill a two-step hole where the smaller hole diameter allows the spring pin 8 plunger 17 to pass through the hole and stop the barrel 18 from passing. This step captures the pin in the socket.

Ground Pin

The ground pin or return path pin must be electrically connected to the return path of the coax signal pin. Ground pins are made the following the steps shown in FIGS. 9A-9H.

Figure 9A:
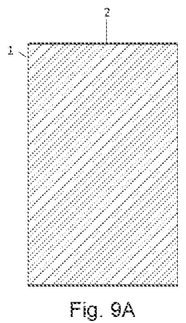
FIG. 9A is the first step.
Figure 9B:
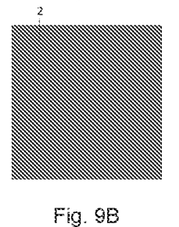
FIG. 9B is the top view of FIG. 9A.

Step 1: Use same socket body created in step 1 for coax pin structure

Figure 9C:
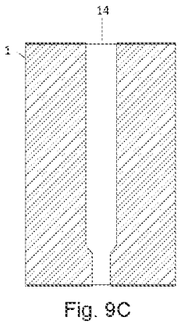
FIG. 9C is the second step.
Figure 9D:
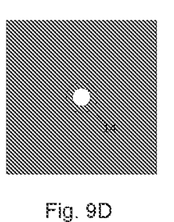
FIG. 9D is the top view of FIG. 9C.

Step 2: Drill a two-step hole in the desired location 14.

Figure 9E:
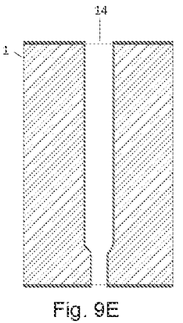
FIG. 9E is the third step of the assembly.
Figure 9F:
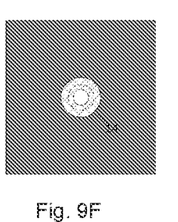
FIG. 9F is the top view of FIG. 9E.
Figure 9G:
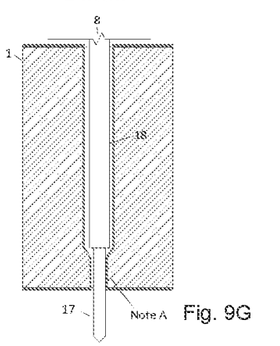
Figure 9H:
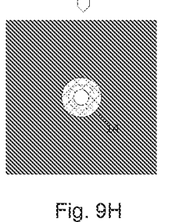
FIG. 9H is the top view of FIG. 9G.

Step 3: Plate the hole with copper, nickel, and hard gold. The diameter of the small part of the two step hole 14 drilled in step 2 should allow the plunger of the spring pin 17 to pass through while being too small to allow the barrel 18 from passing through.

In FIGS. 9A-9H, the gold-plated surface of the ground hole 14 will make electrical connection with the spring pin 8. The hard gold plating provides a long-term mating contact with the plunger of the spring pin 17 over multiple thousands of compressions of the spring pin 8.

For best performance there should be at least one adjacent ground pin to every coax signal pin. See FIGS. 9A-9H. The ground pin provides the return path for the coax signal transmission line.

Power Pin

The power pin is similar to the ground pin but it is isolated from the ground plane and can have adjacent vias to enable greater current carrying capacity or lower impedance. For example a power pin may have an impedance in the range of 0.6 to 10 ohms and a current carrying capacity up to 10 amps. Power pins are made following the steps shown in FIGS. 10A-10H.

Figure 10A:
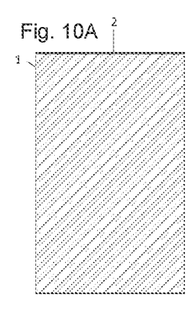
FIG. 10A is the first step.
Figure 10B:
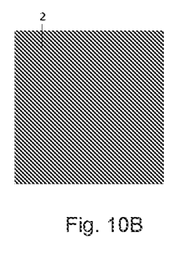
FIG. 10B is the top view of FIG. 10A.
Figure 10C:
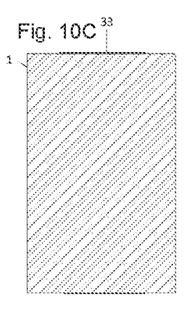
FIG. 10C is the second step.
Figure 10D:
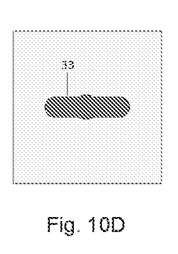
FIG. 10D is the top view of FIG. 10C.
Figure 10E:
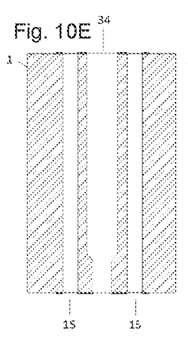
FIG. 10E is the third step of the assembly.
Figure 10F:
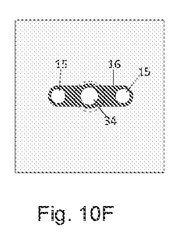
FIG. 10F is the top view of FIG. 10E.

Step 1: Use same socket body created in step 1 for coax pin structure

Step 2: Etch the copper around the power pin but leave a path between the additional vias and spring pin hole 34. Step 3: Drill two stepped via 34 and vias 15.

Figure 10G:
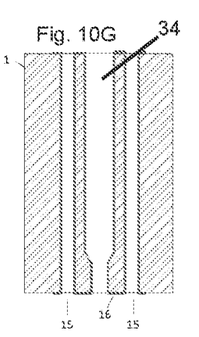
FIG. 10G is the fourth step.
Figure 10H:
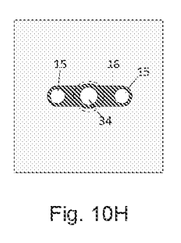
FIG. 10H is the top view of FIG. 1G.

Step 4: Plate the vias with copper, nickel, and hard gold.

Panelized Manufacturing:

While there are alternate manufacturing methods of the concept for those skilled in the art the above-mentioned processes is designed to be manufactured using common PCB manufacturing process which are a panelized and highly optimized process. Creating sockets using PCB manufacturing equipment allow for high volumes of sockets to be manufactured with lower cost than the standard manufacturing processes.

This also allows for easy customization using common PCB tools to select specialized hole patterns that are application specific to the target design. The overwhelming majority of sockets do not distinguish between contacts and thus have a single pin structure for every type of signal pin, power pin, or ground pin. Having sockets with customizable structures for each pin type will provide a performance advantage compared to a single pin structure.

While presently preferred embodiments have been described for purposes of the disclosure numerous changes in the arrangement of method steps and apparatus parts can be made by those skilled in the art. Such changes are encompassed within the spirit of the invention as defined by the appended claims.

The invention claimed is:

1. A method of creating high-performance coaxial (coax) sockets in printed circuit boards (PCB), the method comprising steps of:
   a. laminating a first printed circuit board (PCB), said PCB having a core and PCB pre-preg laminates that are laminated together forming a single PCB sheet of material for a coaxial body;
   b. machining said single PCB sheet of material to a target thickness in a range from 0.030 inches and 0.150 inches;
   c. drilling holes in said single PCB sheet of material for a primary hole for a coaxial socket and vent holes;

d. electroplating said primary hole with conductive material;

e. removing selected conductive material from a surface of said single PCB sheet of material to provide a large enough gap between a return path and a coax pin to be retained in said coaxial socket, said pin having a coax pin plunger, wherein said coax pin is a power pin isolated from a ground plane and having adjacent vias, said coax pin configured for low impedance or configured to provide a desired current carrying capacity, wherein the coax pin is further characterized as having an impedance in the range of 0.5 to 10 ohms and a current carrying capacity up to 10 amps;

f. drilling a hole in said single PCB sheet of material for said coax pin plunger to go through; and repeating steps a-f for a second printed circuit board (PCB) to form a second PCB sheet, and assembling said first and second PCB sheets together to form a coaxial board, and placing a spring pin in said core of said coaxial board to be retained in said core.

2. The method according to claim 1 wherein said electroplating conductive material is copper.

3. The method according to claim 1, wherein in creating each of said coaxial socket bodies, a layer of electrical conductive material is added or left on a top or bottom surface of each said body for electroplating subsequently.

4. The method according to claim 1, wherein said target thickness will vary within said range depending on said spring pin type and a device under test (DUT) requirements.

5. The method according to claim 1, further including a generic pin hole and wherein said generic pin hole does not require plating in the hole for the generic pin, or generic pin, respectively and a two-step hole is drilled for placement of said generic pin including a larger hole and a smaller hole, where said smaller hole that allows said plunger of said generic pin to pass there-through said smaller hole and block a barrel or circumference of said generic pin from passing through said smaller hole capturing said generic pin in said coax socket.

6. The method according to claim 1, further including a ground pin and a two-step hole is drilled for placement of said ground pin including a larger hole and a smaller hole, said hole being plated with electrically conductive material including gold, copper or silver material, and where said smaller hole that allows said plunger of said ground pin to pass there-through said smaller hole and block a barrel or circumference of said ground pin from passing through said smaller hole capturing said ground pin in said coax socket, said plating on a surface of said ground hole providing electrical connection with said spring pin for connection with said ground pin over multiple compressions.

7. The method according to claim 6, wherein there is at least one adjacent ground pin for each spring pin where said ground pin provides a return path for a coax transmission line.

8. The method according to claim 1, further including:

etching said conductive material around said power pin leaving a path between additional vias and a spring pin hole;

drilling a plurality of two-step vias; and plating said vias with electrically conductive material including copper, gold or silver.

9. The method according to claim 1, wherein a dielectric guide frame is added to either a top or a bottom socket body to hold all pins in a vertical orientation.

10. The method according to claim 9, wherein said dielectric guide frame electrically isolates said socket body from said PCB.

11. The method according to claim 10, further including a solder ball nest added subsequently to said dielectric guide frame, wherein said solder ball nest serves to align a device under test's (DUT's) solder balls with the spring pins.

12. The method according to claim 9, further including screws to assemble all aligned pieces together as an assembly.

* * * * *